US005338897A

United States Patent [19]

Tsay et al.

[11] Patent Number: 5,338,897
[45] Date of Patent: Aug. 16, 1994

[54] COAXIAL SHIELD FOR A SEMICONDUCTOR DEVICE

[75] Inventors: Ching-Yuh Tsay, Richardson; Khen-Sang Tan, Plano, both of Tex.

[73] Assignee: Texas Instruments, Incorporated, Dallas, Tex.

[21] Appl. No.: 738,010

[22] Filed: Jul. 30, 1991

[51] Int. Cl.$^5$ ............................................. H05K 9/00
[52] U.S. Cl. ............................... 174/35 R; 174/71 C; 174/103; 174/104; 437/52
[58] Field of Search ............... 437/52; 257/676, 659, 257/660; 174/35 R, 71 C, 75 C, 88 C, 103, 104; 361/424

[56] References Cited

U.S. PATENT DOCUMENTS 5,068,712 11/1991 Murakami et al. ............... 257/676
5,180,683 1/1993 Wakamiya et al. ............... 437/47

FOREIGN PATENT DOCUMENTS 0343269 11/1989 European Pat. Off. .

Primary Examiner—Leo P. Picard
Assistant Examiner—Bot Ledynh
Attorney, Agent, or Firm—Jacqueline J. Garner; Richard L. Donaldson; William E. Hiller

[57] ABSTRACT

In a semiconductor device, an on chip coaxial cable reduces noise from adversely affecting a signal transmitted by a signal conductor. The signal conductor lies within and is isolated from a second conductor. A dielectric, such as oxide, may provide isolation. In multi level metal devices, such as double level metal devices, the signal conductor can be formed of a first level of metal and a portion of the second conductor can be formed of the first level of metal also. After forming a first level of metal, it is patterned to separate the first signal conductor from a first conductive noise shield and a second conductive noise shield. A second level of metal and a conductive level of material such as polysilicon can complete formation of the second conductor. Oxide insulators can provide isolation between the signal conductor and the second conductor by lying between the top conductive noise shield and the signal conductor and by lying between the bottom conductive noise shield and the signal conductor. Interlevel connectors such as vias and contacts in the oxide insulators provide electrical coupling between the various levels of the second conductor. A signal carrier is centered inside and insulated from an outer conductor on a semiconductor chip and provides an on chip coaxial cable that protects the signal carrier from noise disturbances. The second conductor may be electrically biased, such as to ground, by connecting the bottom conductive noise shield to a voltage source to enhance noise reduction.

15 Claims, 9 Drawing Sheets

COAXIAL SHIELD FOR A SEMICONDUCTOR DEVICE

FIELD OF THE INVENTION

This invention relates to integrated semiconductor devices and more particularly to signal transmission line layout of the devices.

BACKGROUND OF THE INVENTION

The quest to develop larger and larger semiconductors of the dynamic random access memory (DRAM) type is a well-known goal. The industry has steadily progressed from DRAMs of the 16 K type, shown in U.S. Pat. No. 4,081,701 issued to White, McAdams and Redwine, and the 64 K type, shown in U.S. Pat. No. 4,055,444 issued to Rao, to DRAMs of the 1 M type, as described in U.S. Pat. No. 4,658,377 issued to McElroy. DRAMs of the 4 M type are now being produced. Production plans for 16 M DRAMS of submicron technology now exist and U.S. Pat. No. 5,017,506 issued to Shen, Yashiro, McKee, and Chung, on May 21, 1991 describes a process suitable for manufacturing high density 16 M DRAMS. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al, (a trench capacitor cell). The 16 M DRAM citor cell), and as illustrated in U.S. Pat. No. 4,721,987 described in U.S. Pat. No. 5,017,506 has submicron dimensions.

A problem encountered by designers in manufacturing high density devices is noise. Among undesirable items, noise may cause circuits to inadvertently switch, may cause data loss, and may disturb signal levels. As geometries continue to decrease and as devices become more tightly packed on a semiconductor die, the opportunity for noise to create problems increases.

It is an object of this invention to reduce noise in integrated semiconductor devices.

It is a further object of this invention to provide noise shielding in integrated semiconductor devices.

Other objects and advantages of this invention will be apparent to those of ordinary skill in the art having reference to the following specification and drawings.

SUMMARY OF THE INVENTION

The invention provides an on chip coaxial cable to reduce noise from adversely affecting a signal transmitted by a conductor. A signal conductor is laid out on a semiconductor chip. The signal conductor lies within and is isolated from a second conductor. In a multi level metal device, such as double level metal, the signal conductor can be formed of a first level of metal and the second conductor may be partially formed of the first level of metal also. The first level of metal is patterned to separate the first signal conductor from part of the second conductor formed along with it. A second level of metal and a conductive level of material such as polysilicon can complete formation of the second conductor. The level of polysilicon may underlie the signal conductor and may be connected to a voltage potential to further enhance noise reduction. The second level of metal overlies the signal conductor. Oxide insulators can provide isolation between the signal conductor and the second conductor. Interlevel connectors such as vias and contacts in the oxide insulators allow electrical coupling between various levels of the second conductor. A signal carrier is centered inside and insulated from an outer conductor on a semiconductor chip and provides an on chip coaxial cable that protects the signal carrier from noise disturbances.

DETAILED DESCRIPTION OF THE PREFERRED EMBODIMENT

Figure 1:
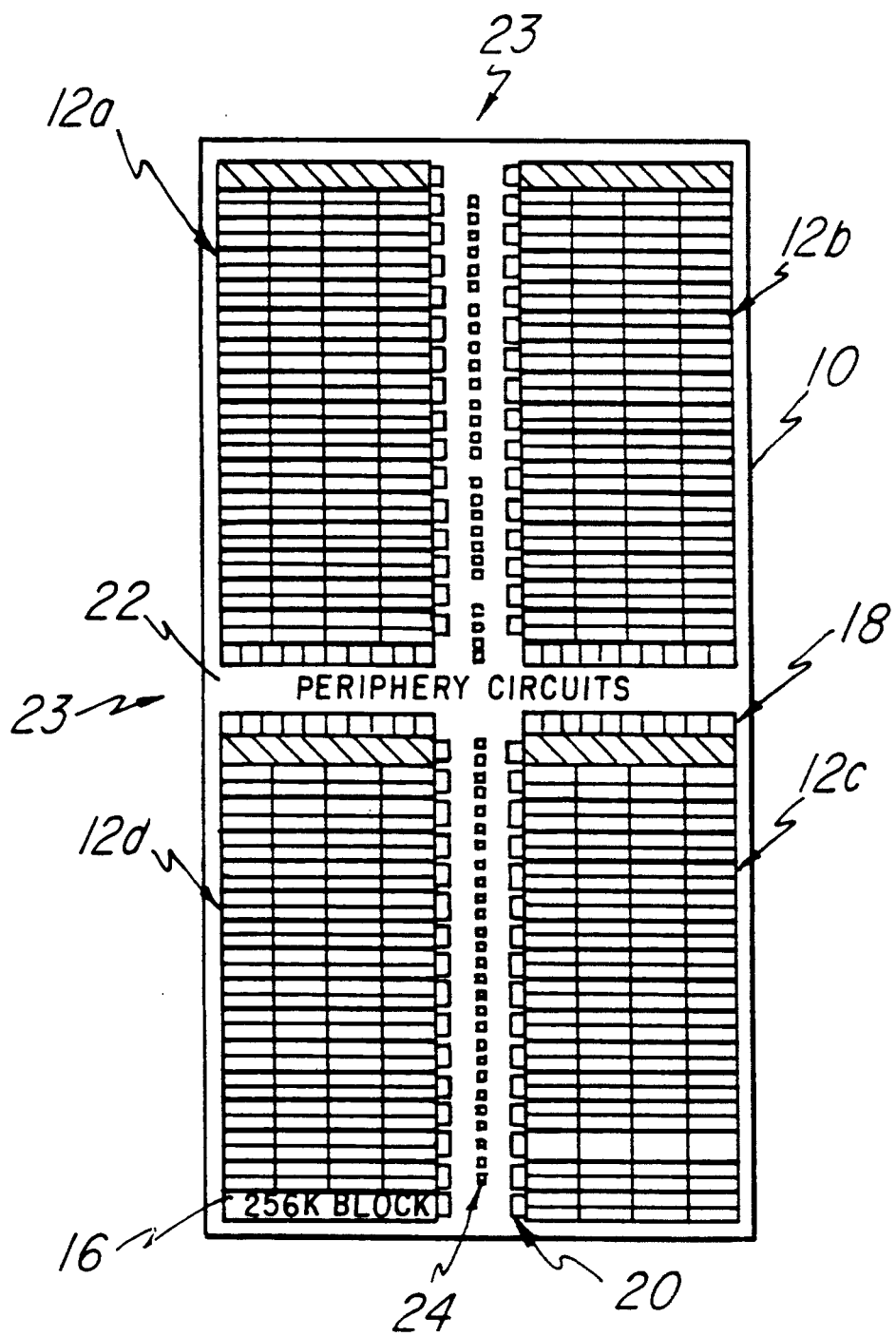
FIG. 1 is a block system level drawing illustrating a semiconductor integrated circuit device on a substrate incorporating the preferred embodiment of the invention.

Referring to FIG. 1, the noise shield structure of the invention may be used ill isolating signals on a semiconductor chip 10 having a dynamic random access memory array 12 formed in a face thereof generally by a submicron process such as disclosed U.S. Pat. No. 5,017,506 issued May 21, 1991 that is assigned to Texas Instruments Incorporated. The dram circuitry may be, for example, a 16 Megabit Dynamic Random Access Memory. The memory array 12 is partitioned into four memory quadrants 12a–12d of 4 Megabits each lying in the active face of semiconductor chip 10 that is formed of silicon. Each memory quadrant 12a–12d contains sixteen memory blocks 16 of 256 Kilobits each. Each memory block 16 contains 2048 bit lines 17, or columns, contains 1024 sense amplifiers, and has 256 word lines 19, or rows. (The bit lines, word lines, and sense amplifiers are not illustrated in FIG. 1 for clarity.) The column decoders 18 lie along the vertical axis 23 of the chip adjacent to their respective memory array quadrants. The row decoders 20 lie along the horizontal axis 25 of the chip adjacent to their respective memory array quadrants. The periphery circuits 22, containing such devices as the input and output buffers and the timing and control circuits, are formed in the periphery of the substrate and are centrally located along the vertical axis of the chip while the bond pads 24 are centrally located along the horizontal axis of the chip. Although not illustrated in FIG. 1 for clarity, the DRAM receives addresses signals A0–A11 and its operation is controlled by the standard signals Row Address Strobe RAS__, Column Address Strobe CAS__, and Write Enable W__.

The size of semiconductor chip 10 is about 327 × 660 mils.

Figure 2:
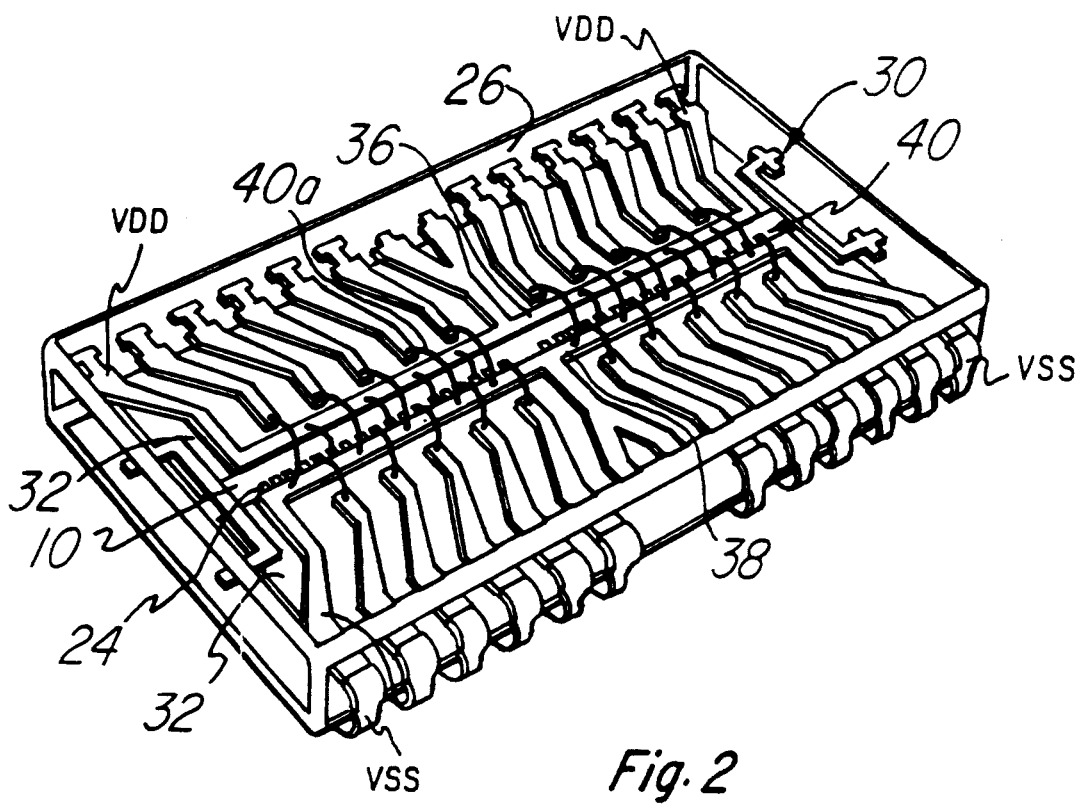
FIG. 2 is a three dimensional view of the packaged, encapsulated, semiconductor integrated circuit device wherein the encapsulant is rendered transparent.
Figure 3:
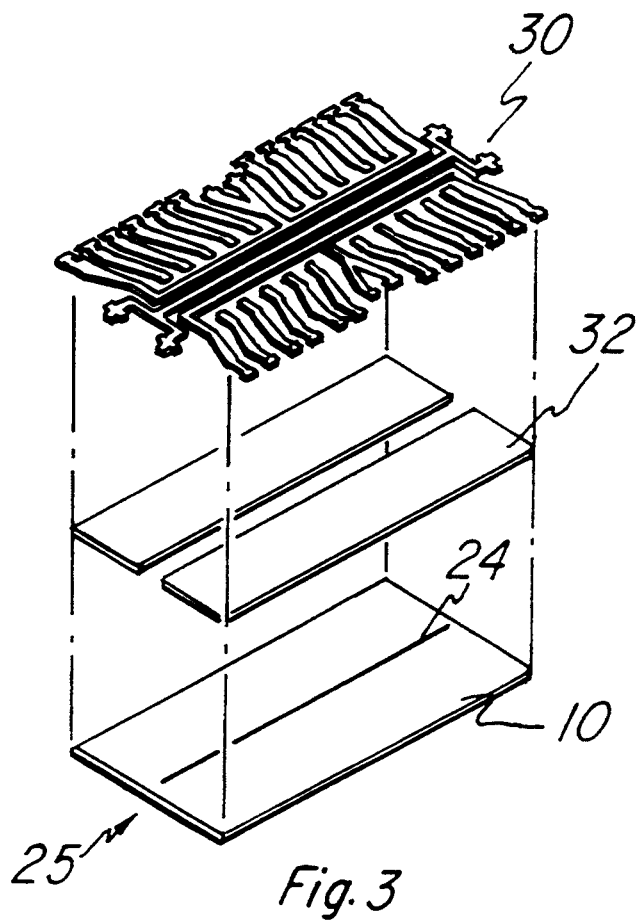
FIG. 3 is a partial assembly view of FIG. 2.

FIG. 2 depicts a three dimensional view of the encapsulated chip 10 wherein the encapsulant 26 is rendered transparent while FIG. 3 presents an assembly view. The chip 10 is encapsulated in a thin plastic small outline J-type package of the lead over chip center bond (LOCCB) type. The chip 10 underlies the lead frame 30. Two strips of polyimide tape 32 attach the chip 10 to the lead frame 30. The two strips of tape 32 are positioned along the horizontal axis 25 of chip 10 on opposite sides of the bond pads 24 leaving the bond pads uncovered and exposed. When assembled, the bond pads 24 lie between the Vdd power supply bus 36 and the Vss power supply bus 38 of the lead frame 30. Various wire bonds 40 attach the Vdd power supply bus 36 and the Vss power supply bus 38 to various of the bond pads 24 allowing multiple connections from the power supply busses to the semiconductor chip 10. Other wire bonds, such as wire bond 40a, cross over the power supply busses and attach the lead fingers 40 to the bond pads 24. These crossing wire bonds do not touch the power supply busses and no shorting occurs. The size of the encapsulated package is about 400×725 mils.

Figure 4:
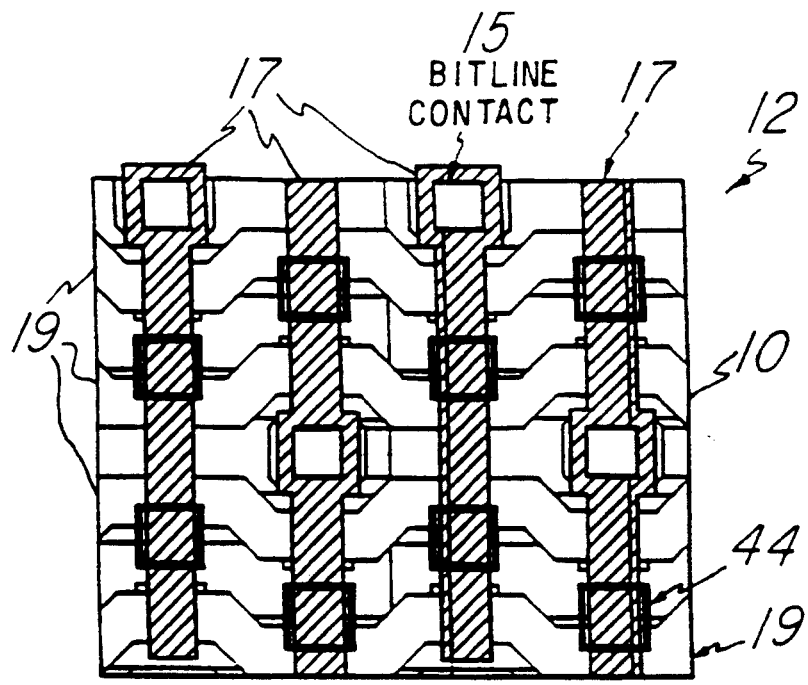
FIG. 4 is a top view of a portion of the memory array layout of the semiconductor integrated circuit device.

FIG. 4 is a top view of a portion of memory array 12. The memory cells of memory array 12 are of a trench capacitor type obtained through submicron technology. The memory cells are laid out in a double word line pitch and extend into the substrate 10 about 6 microns deep. The bit lines 17 are polycide and triple twisted for improved noise immunity. The word lines 19 are polysilicon and are strapped every 64 bits.

Figure 5:
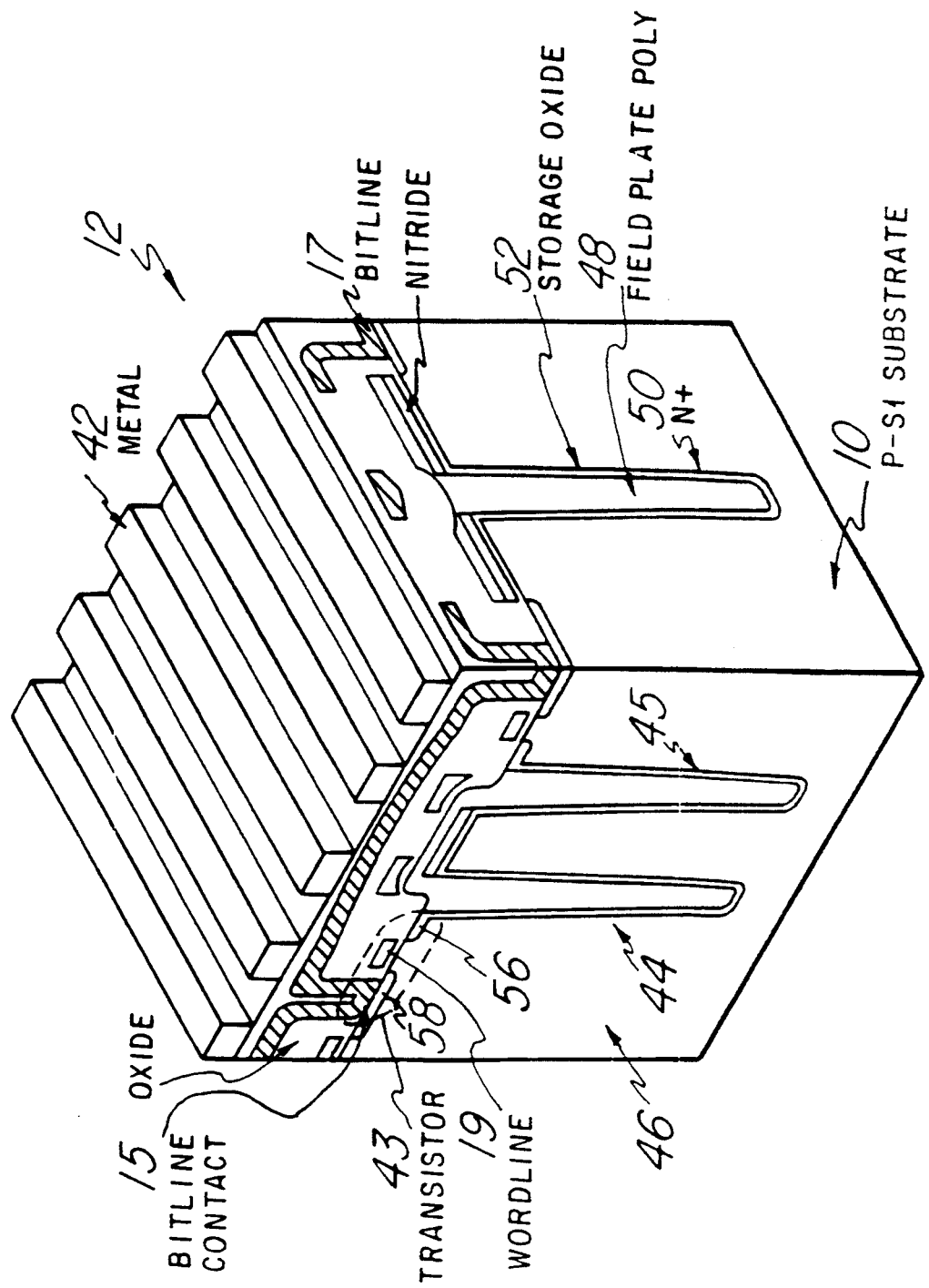
FIG. 5 is a cross sectional view of the memory cells of the memory array.
Figure 6:
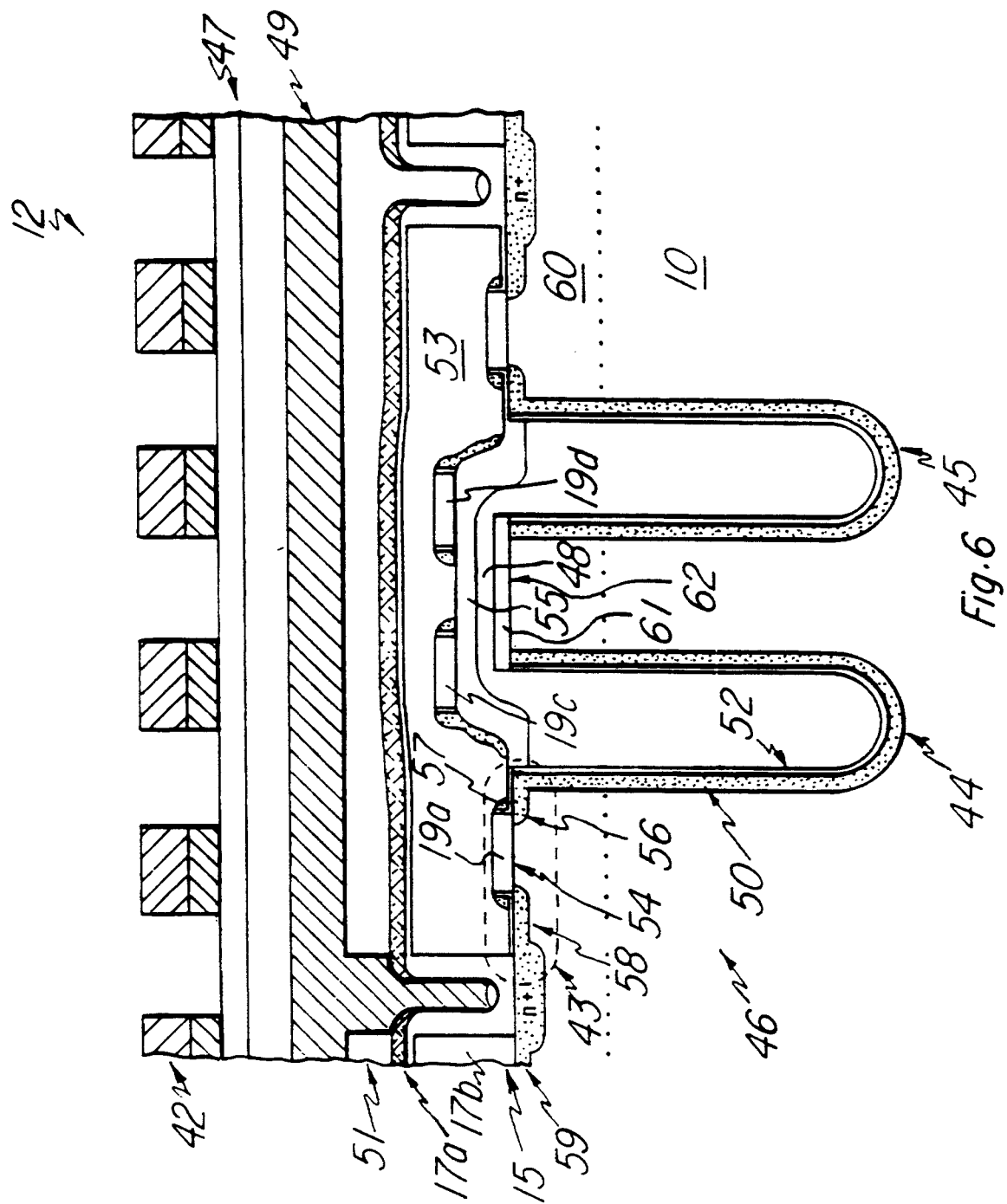
FIG. 6 is a side view of the memory cells.

FIG. 5 presents a three dimensional view of a portion of the memory array 12 while FIG. 6 presents a cross section view. An interconnect metal-2 layer 42 accomplishes word line strapping and may be used in the noise shield structure of the invention as is later described. Metal-2 layer 42 is a second level of metal on semiconductor chip 10. An oxide layer 47 separates metal-2 layer 42 from a metal-1 layer 49. Metal-1 layer 49 is a multi level interconnect metal 49 that accomplishes contacts to the bit lines and may be used in the noise shield structure. Metal-1 layer 49 is a first layer of metal on semiconductor chip 10. The integrated circuit memory device formed on semiconductor 10 is thus a double level metal structure having a first metal layer 49 and a second metal layer 42. An oxide layer 51 lies below interconnect metal-1 49 to provide isolation between the silicided bitlines 17 and metal layer 49. The bit lines 17 comprise a layer of titanium silicide 17a overlying a layer of polysilicon 17b. An oxide layer 53 lies beneath the bit lines 17 and lies over the word lines 19. The polysilicon word lines 19 have a submicron width of about 0.6 microns. Word line 19a forms the gate of pass transistor 43. It is separated from the substrate 10 by an oxide layer 54. Word lines 19c and 19d pass over the top trench capacitors 44 and 45 and connect to other trench capacitors not shown. They are separated from the polysilicon field plate 48 by an oxide layer 55. The word lines 19 have side walls 57 of nitride. An N+ diffusion 59 lies in the P-tank 60 underneath the bit line contacts 15 and between word line 19a and trench capacitor 44. The N+ diffusion 59 thus forms the source 56 and the drain 58 of the pass gate transistor 43. Underneath field plate 48, between the trench to trench space separating trench capacitors 44 and 45, lies a nitride layer 61. Between nitride layer 61 and P-tank 60 lies an oxide layer 62. It acts as a buffer layer between the silicon substrate 10 and the nitride layer 61 and is part of the field plate isolating dielectric. The trench capacitors 44 and 45 extend through the P-tank 60 into the P substrate of the silicon wafer 10. A layer 50 of implanted arsenic outside the trench capacitor walls creates the N+ storage node of the capacitors. The trench capacitor walls contain a layer 52 of oxide and nitride that acts as a dielectric layer between the arsenic trench wall implant and the polysilicon field plate 48. Transfer transistor 43 and trench capacitor 44 comprise memory cell 46.

Figure 7:
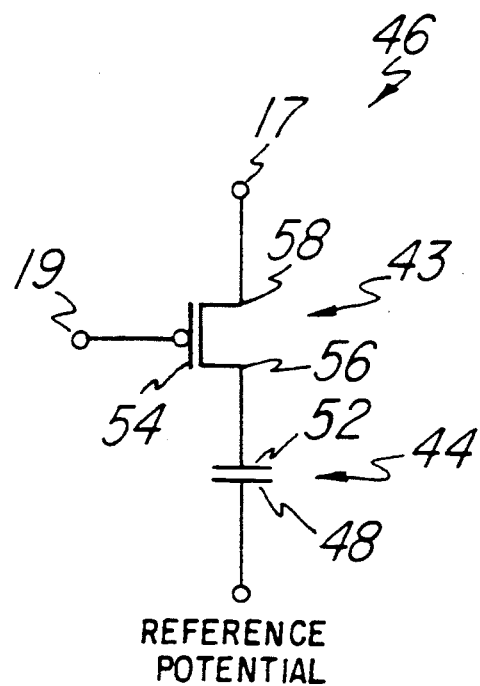
FIG. 7 is an electrical schematic diagram of a memory cell.

FIG. 7 is an electrical schematic diagram showing the electrical operation of transfer transistor 43 and trench capacitor 44. When data is to be stored on memory cell 46, the data, 3.3 v or 0.0 v, is placed on bit line 17 and a high voltage signal (approximately 6 volts) is placed on gate 54. The voltage placed on bit line 17 is passed via source 56 to storage dielectric 52. Field plate 48 is tied to a reference potential of about 1.65 volts and thus a charge representing the voltage applied by bit line 17 is stored on storage dielectric 52. To store the data on storage dielectric 52, the positive voltage is removed from gate 54 thus stopping continuity between source 56 and drain 58.

Figure 8:
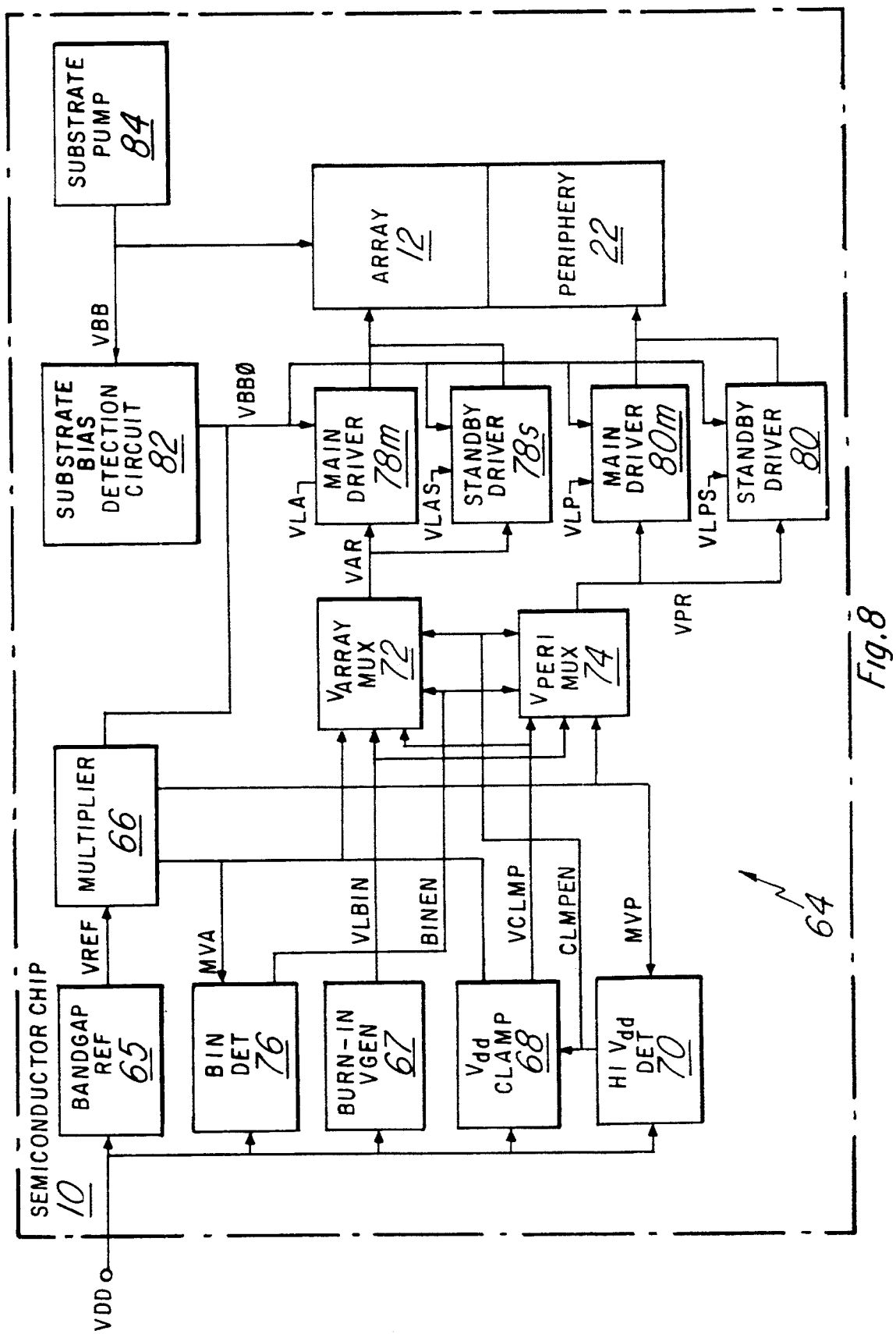
FIG. 8 is a block diagram illustrating an on chip regulated voltage system having voltage lines that may be advantageously protected by the noise shield structure of the invention.

FIG. 8 is a block diagram depicting an on chip voltage generator system 64 which produces bias voltages VAR and VPR. The bias voltages may be protected by the noise shield structure of the invention. The DRAM receives external positive voltage Vdd that is typically 5 volts. The on chip power supply regulation system 64 provides different bias voltages for array 12 (including some circuitry associated therewith, such as the sense amplifiers, herein collectively referred to as array 12) and for periphery 22. It is desirable in this case to bias the array 12 with a voltage below the externally applied Vdd voltage of 5 volts so that the power dissipation by the array and the time-dependent dielectric breakdown of the memory capacitor dielectric is reduced. This also helps prevent oxide failures of the thin gate oxide of the transistors. The memory array 12 is biased at about 3.3 volts by the voltage VARRAY. The periphery 22 is biased at about 4 volts by the voltage VPERI. Since the performance of the periphery 22 directly affects the performance of the semiconductor device, it may be preferable to bias the periphery 22 with a voltage that is higher than that used to bias the array 12. However, both the array 12 and the periphery 22 may be biased at the same voltage and the voltage regulator system, with slight modification, can supply equal values for the voltages VPERI and VARRAY. The generated bias voltages may be small, as would be the case if the DRAM were incorporated into a lap top computer system (wherein the battery power for the system is typically on the order of about 2.8 volts+or−about 0.8 volts). The supplied equal values may be of same value as supplied by the battery for the lap top computer. Also, in case the semiconductor and computer industry agree to lower the standard 5 volt Vdd supply to approximately 3 volts, the bias voltages VPERI and VARRAY may accordingly decrease and may be the same value.

In FIG. 8, bandgap reference circuit 65 generates a voltage Vref that is supplied to a multiplier circuit 66. Many bandgap voltage reference generator circuits are known. The voltage Vref is a stable reference voltage of about 1.2 volts. Voltage multiplier circuit 64 may be constructed according to one of many conventional configurations. It generates, in this example, two output voltages from the voltage Vref, one on line MVA and the other on line MVP. The voltage on line MVA is on the order of about 3.3 volts, while the voltage on line MVP is on the order of about 4.0 volts.

Burn-in voltage generator circuit 66 generates a voltage on line VLBIN that varies with the externally applied power supply voltage Vdd. Vdd clamp circuit 68 provides, on line VCLMP, a voltage that is clamped to a fixed level once the external voltage Vdd exceeds a certain value, as detected by high Vdd detection circuit 70. Line MVA, together with lines VLBIN and VCLMP are connected to inputs of Varray multiplexer 72. Similarly, line MVP, together with lines VLBIN and VCLMP, are connected to inputs of Vperi multiplexer 74.

Varray multiplexer 72 applies at its output, on line VAR, the voltage from one of lines MVA, VLBIN, and VCLMP, responsive to control signals on line BINEN from burn-in voltage detection circuit 76, and on line CLMPEN from high Vdd detection circuit 70. Similarly, Vperi multiplexer 74 applies the voltage on line VPR from one of lines MVP, VLBIN, and VCLMP, depending upon the signals on lines BINEN and CLMPEN. The voltages on lines VAR and VPR may advantageously be protected by the on chip noise shield of the invention. The voltages on lines VAR and VPR output from the multiplexers are stable reference voltages. They do not have sufficient drive capability to power the array and periphery.

In FIG. 8, the voltage on lines VAR and VPR are each connected to two drivers 78 and 80. Driver 78 comprises as a main driver 78M and a stand by driver 78S. Driver 78 drives array 12 with the voltage VARRAY. Driver 80 comprises a main driver 80M and a standby driver 80S. Driver 80 provides periphery 22 with the voltage VPERI. Main drivers 78M and 80M provide bias voltage to array 12 and periphery 22, respectively, during active operation, while standby drivers 78S and 80S provide bias to array 12 and periphery 22, respectively, when the circuit is in a standby condition. Standby drivers 78S and 80S are constructed similar to main drivers 78M and 80M, having smaller transistors so that the current drawn therethrough, and the power dissipated thereby, is reduced during such standby times. Each of drivers 78 and 80 are biased by Vdd (not shown) that is externally presented to the chip. Lines VLA, VLAS, VLP, and VLPS are received by drivers 78M, 80M, 78S, and 80S, respectively, and serve as enable signals thereto. The enabling signals on lines VLA and VLP can be generated from the row address strobe (RAS_) signal received by DRAM 10, so that main drivers 78 are active only during the active portions of memory cycles.

Substrate bias detection circuit 82 is connected to the substrate voltage Vbb produced by substrate pump circuit 84. The drivers 78 and 80 receive signal VBB0_ from substrate bias detection circuit 82. Signal VBB0_, active low, is also a control signal for drivers 78 and 80. Signal VBB0_ will have a low logic level in the event substrate bias Vbb is insufficient, as measured against Vss. The drivers are responsive to the VBB0_ output of substrate bias detection circuit 82 so that array 12 and periphery 22 are powered down in the event of loss of substrate bias. This powering down of array 12 and periphery 22 helps protect those portions of the integrated circuit from damage due to latchup of the parasitic SCR inherent in CMOS structures.

Substrate pump 84 produces the voltage Vbb used to bias the substrate of semiconductor 10 to about −2.0 volts with respect to the Vss or ground potential applied to the chip.

Figure 9A:
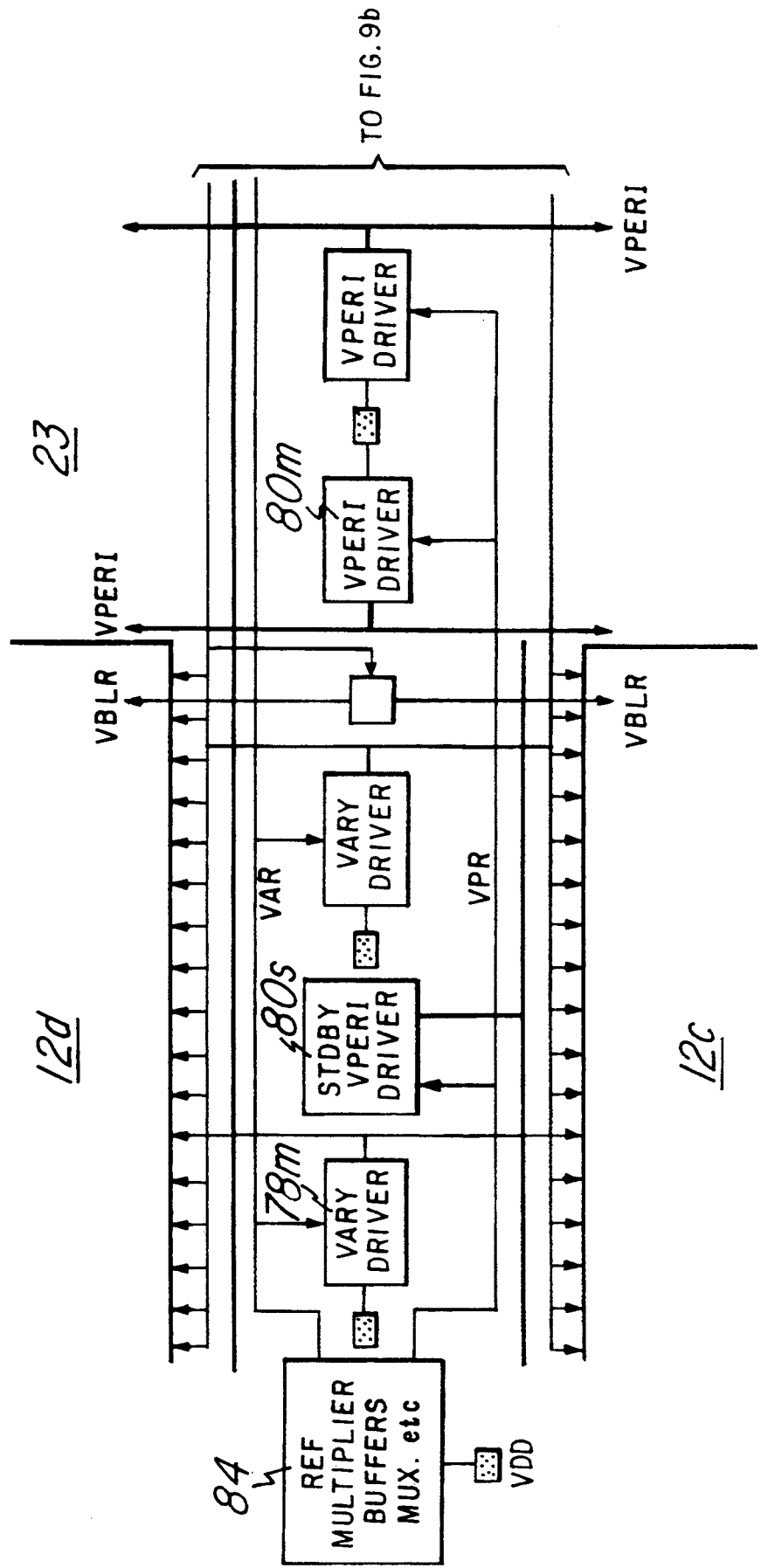
FIG. 9a and FIG. 9b depict a block level diagram illustrating a layout of a portion of the regulated voltage system.
Figure 9B:
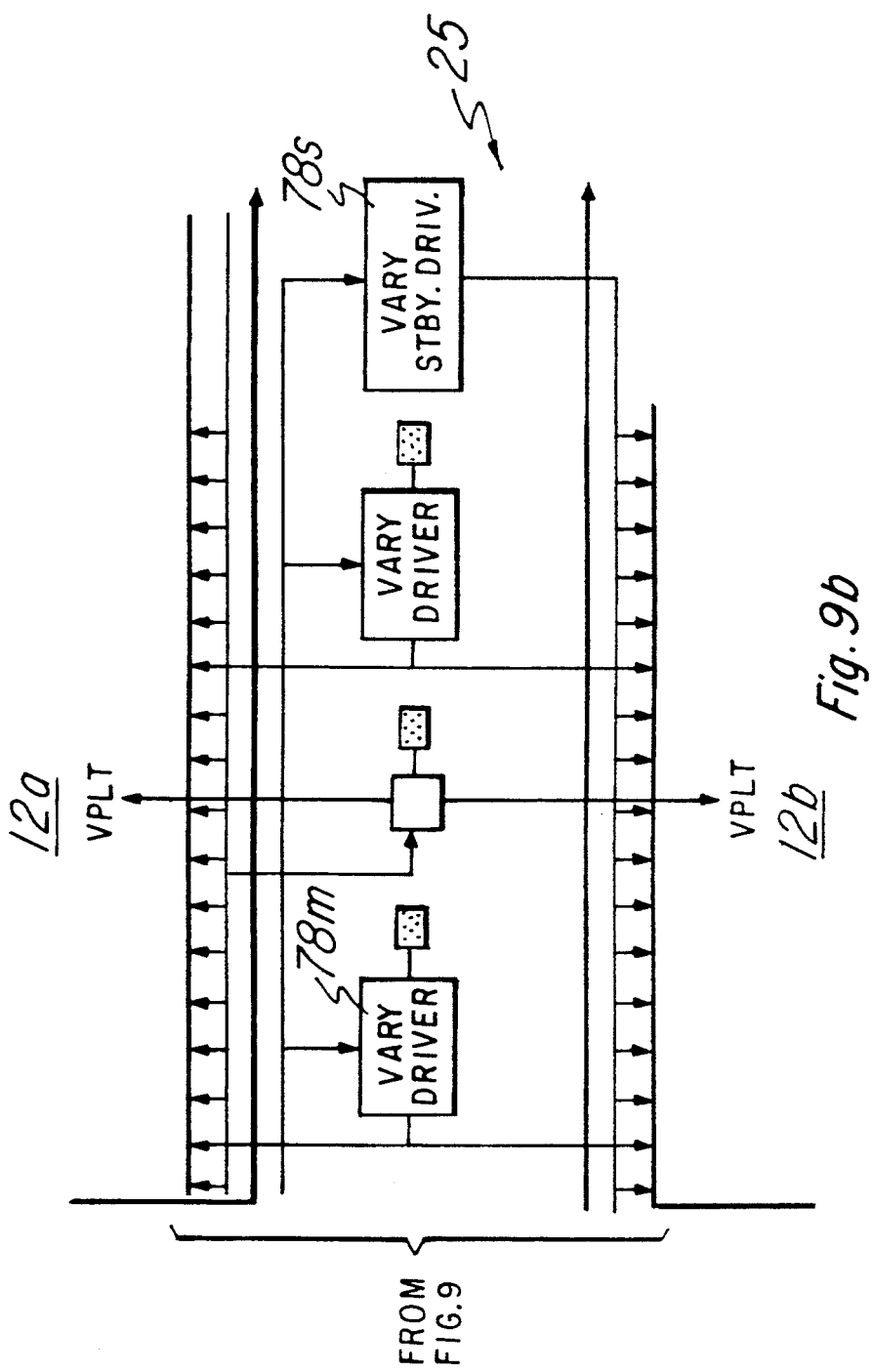

FIG. 9 is a block level drawing depicting a partial layout of the voltage regulator system on the semiconductor chip. The system is laid out in the chip area between the memory array quadrants. Block 84 depicts the combined bandgap reference generator 65, multiplier 66, and multiplexers 72 and 74. Block 84 outputs the stable reference voltages VAR and VPR. The voltages VAR and VPR run along the periphery next to the memory array quadrants and provide bias to their respective Vary and Vperi drivers. Not shown in FIG. 9 for clarity are the row decoders for the memory quadrants that are illustrated in FIG. 1. With the row decoders operating, the drivers operating, and with other signals, not illustrated, lying near or crossing over the voltage lines VAR and VPR, there are many opportunities for noise to adversely affect these sensitive signal levels. However, these voltage lines are protected from noise by the noise shield structure of the preferred embodiment of the invention.

Figure 10A:
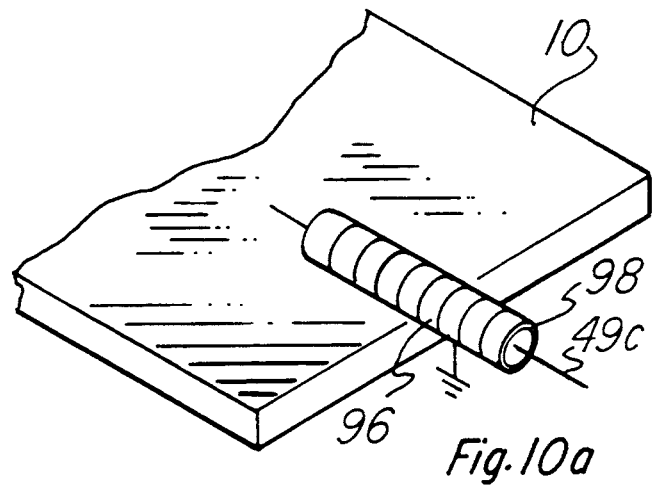
FIG. 10a is a block type diagram illustrating the concept of invention on a semiconductor substrate.
Figure 10:
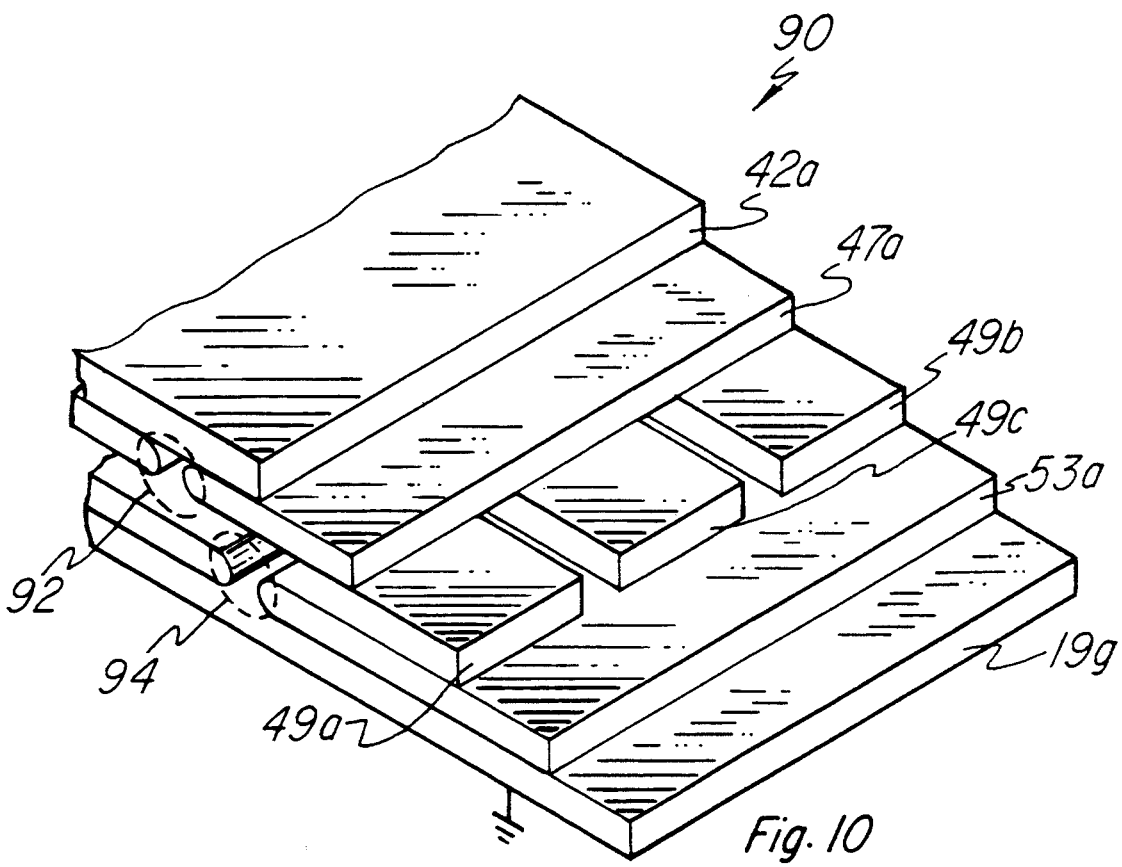
FIG. 10 is a partial perspective view of the preferred embodiment of the noise shield structure of the invention.

FIG. 10 is a partial end perspective view illustrating the preferred embodiment of the invention. An on chip noise shield structure 90 provides noise shielding for a signal carried on center conductor 49c. The stable reference voltages VAR and VPR of FIGS. 8 and 9 can be protected against noise by transmitting them through on chip coaxial cable structures. Three levels of conductive material are used to form the noise shield structure. In the double level metal DRAM described with reference to FIG. 6, a top level 42a of conductive material could be formed of metal-2 layer 42. The top layer 42a provides a top noise shield for center conductor 49c. It may advantageously be formed on the silicon substrate when metal layer 42 is formed. The bottom layer 19g of conductive material may be formed of gate polysilicon 19. It could also be formed of the polyside bit lines 17. The bottom layer 19g provides a bottom noise shield for center conductor 49c. It may advantageously be formed on the silicon substrate when the gate polysilicon word lines 19 are formed. A center conductor 49c and side layers 49a and 49b are a middle conductive level between the top conductive level and the bottom conductive level. They may be formed of metal-1 layer 49. Side layers 49a and 49b provide side noise shields for center conductor 49c. Center conductor 49c carries the signal to be protected. For example, it may carry the voltage VAR. Side shields 49a and 49b and center conductor 49c may advantageously be formed on the silicon substrate when the metal-1 layer 49 is formed.

In FIG. 10, a top insulator 47a separates top shield 42a from center conductor 49c. Top insulator 47a in the DRAM embodiment could be formed of oxide 47 and processed at the same time as oxide 47. A bottom insulator 53a separates bottom shield 19g from center conductor 49c. Bottom insulator a in the DRAM of FIG. 6 could be formed of oxide 53 and processed at the same time as oxide 53.

In FIG. 10, side shields 49a and 49b lie on either side of center conductor 49c in the same level of conductive material; however, they are not in electrical contact with center conductor 49c. They are spaced apart and separated from center conductor 49c. Insulator 47a may fill the space separating center conductor and side shield 49a and may fill the space separating center conductor and side shield 49b. When forming the on chip noise shield 90, after the middle conductive level metal-1 layer 49 is formed, it can be patterned, by etching for example, to separate the center conductor 49c from the side shields 49a and 49b. When the oxide layer 47a is later formed, by growing it through steam oxidation for example, it can fill the area within the middle conductive level between the center carrier 49c and the side conductors with insulating oxide.

In FIG. 10, top shield 42a, side shields 49a and 49b, and bottom shield 49c are all in electrical contact with each other. Vias in top oxide 47a are interlevel connectors providing electrical connection between top conductive level shield 42a and middle conductive level side shields 49a and 49b. One such via 92 is illustrated. The via 92 provides an aperture in top insulating layer 47a. The metal of top noise shield 42a fills the via and makes electrical contact with side shield 49a. As many vias as necessary may be used to provide good electrical connection. The vias 92 providing contact between top shield 42a and side shield 49b are not illustrated for clarity. Contacts in bottom oxide 53a are similarly interlevel connectors providing electrical connection between middle conductive level side shields 49a and 49b and bottom conductive level shield 19g. A contact 94 is illustrated. As many contacts as needed may be used to provide good electrical connection. The contacts 94 in oxide 53a may be created during processing when contacts are formed in oxide 53 for the periphery. Likewise, the vias 92 in oxide 47a are formed when vias in oxide 47 are formed over the periphery.

Since the noise shield structure may be processed as the device is being fabricated, it may have feature sizes comparable with those of the device, although this is not a necessity. For example, in the memory device described above, the polysilicon bottom shield 19g might have a thickness of about 3000Å. The oxide 53 may have a thickness of approximately 3000Å and the oxide 47a could be about 12000Å thick. The top noise shield 42a may be about 6000Å thick and the side noise shields 49a and 49b might be about 5500Å thick.

FIG. 10a depicts a coaxial cable structure on a semiconductor substrate. With reference to FIGS. 10 and 10a, with the top shield 42a, the bottom shield 19g, and the side shields 49a and 49b all being electrically connected, a conductive structure 96 thus surrounds carrier 49c. Carrier 49c lies in the center of a conductive structure. Carrier 49c forms an inner conductor and conductive structure 96 forms an outer conductor. The inner conductor is separated from the outer conductor by dielectrics 47a and 53a that form insulator 98. With the inner conductor 49c centered inside and isolated from an outer conductor 96, an on chip coaxial cable structure is formed. A signal travelling within center conductor 49c is protected against noise disturbance by the coaxial cable structure. In the embodiment of the memory device above described, the outer conductor 96 may be connected to a voltage potential. This may be accomplished easily by connecting the bottom polysilicon conductor 19g to a ground voltage terminal on the semiconductor substrate. Connecting the outer noise shield to a common voltage potential such as ground further reduces noise disturbance on the signal carrier.

The invention thus features an on chip coaxial structure with a signal carrier lying within an outer conductor and insulated from the outer conductor by a dielectric. The outer conductor may be grounded to further enhance noise prevention. The inventive structure may be advantageously formed during processing double level metal devices without adding extra processing steps and is particularly suited for high density double level metal devices such as DRAMS.

Although described in relationship to a DRAM and in relationship to isolating voltages from noise, the invention is not limited to DRAMs or memory devices, or voltage transmission lines. It has broad usefulness in integrated circuit devices generally where a signal needs to be protected from noise. Examples of other devices benefitting from the invention may include, but is not limited to, logic devices, microprocessors, controllers, and linear devices. Clock lines in microcomputers and prebuffered output signal lines in logic devices are just two examples of many of the types of signals that may benefit from being protected.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A protected signal conductor for a semiconductor device, comprising:
 a signal conductor on a semiconductor die disposed between and isolated from a top conductor, a bottom conductor, a first side conductor, and a second side conductor; and
 wherein the top conductor, the bottom conductor, the first side conductor, and the second side conductor are electrically biased.

2. The protected signal conductor of claim 1 wherein the top conductor, the bottom conductor, the first side conductor, and the second side conductor are coupled together so that they are electrically biased at the same potential.

3. The protected signal conductor of claim 2 wherein an insulating dielectric lies between the signal conductor and the top conductor, the bottom conductor, the first side conductor, and the second side conductor to isolate the signal conductor.

4. The protected signal conductor of claim 3 wherein the top conductor is coupled to the first and second side conductors through vias in the insulating dielectric and the first and second side conductors are coupled to the bottom conductor through contacts in the insulating dielectric.

5. An on chip coaxial cable located on the semiconductor chip, comprising:
 a first conductor disposed on the semiconductor chip, centered inside and insulated from a second conductor, wherein the second conductor comprises a top conductor overlying the first conductor, a bottom conductor underlying the first conductor, a first side conductor between the top conductor and the bottom conductor lying next to one side of the first conductor, and a second side conductor between the top conductor and the bottom conductor lying next to another side of the first conductor.

6. The on chip coaxial cable of claim 5 a dielectric lies between the first conductor and the top conductor, between the first conductor and the bottom conductor, between the first conductor and the first side conductor, and between the first conductor and the second side conductor.

7. The on chip coaxial cable of claim 6 wherein the top conductor, the first side conductor, the second side conductor, and the bottom conductor are coupled together through apertures in the dielectric.

8. The on chip coaxial cable of claim 7 wherein the top conductor, the first side conductor, the second side conductor and the bottom conductor are electrically biased at ground potential.

9. The on chip coaxial cable of claim 8 wherein the top conductor, the first side conductor, the second side conductor, and the bottom conductor are electrically biased at ground potential by connecting the bottom conductor to a ground voltage source on the semiconductor chip.

10. A structure to prevent noise from affecting a signal transmitted through a signal conductor on a semiconductor substrate, comprising:
- a first level of conductive material lying on a semiconductor substrate;
- a first level of insulating material lying over the first level of conductive material;
- a second level of conductive material lying over the first insulator that is patterned to have a signal conductor lying between and separated from a first side conductor and a second side conductor, the first side conductor and the second side conductor being connected to the first level of conductive material through interlevel connectors disposed within the first level of insulating material;
- a second level of insulating material lying over the second level of conductive material; and
- a third level of conductive material lying over the second level of insulating material being connected to the first side conductor and the second side conductor through interlevel connectors disposed within the second level of insulating material.

11. The structure to prevent noise of claim 10 wherein the second level of insulating material additionally lies between the signal conductor and the first side conductor.

12. The structure to prevent noise of claim 11 wherein the second level of conductive material and the third level of conductive material is metal.

13. The structure to prevent noise of claim 12 wherein the the first level of insulating material and the second level of insulating material is oxide.

14. The structure to prevent noise of claim 13 wherein the first level of conductive material is polysilicon.

15. The structure to prevent noise of claim 13 wherein the polysilicon is connected to a common potential.

* * * * *